United States Patent [19]

Jin

[11] Patent Number: 5,070,038

[45] Date of Patent: Dec. 3, 1991

[54] METHOD OF FORMING LOW-RESISTIVE CONTACT TO N+/P+ PREOHMIC REGIONS IN VERY LARGE SCALE INTEGRATED DEVICES

[75] Inventor: Dae-Je Jin, Seoul, Rep. of Korea

[73] Assignee: SamSung Electronics Co., Ltd., Suwon, Rep. of Korea

[21] Appl. No.: 289,732

[22] Filed: Dec. 27, 1988

[30] Foreign Application Priority Data

Dec. 24, 1988 [KR] Rep. of Korea ............................ 1224

[51] Int. Cl.[5] .................... H01L 21/40; H01L 21/283
[52] U.S. Cl. .................................... 437/200; 437/192; 437/193; 437/203; 437/202; 148/DIG. 19; 148/DIG. 26; 148/DIG. 147
[58] Field of Search .............. 437/190, 192, 193, 195, 437/188, 200, 203; 148/DIG. 19, DIG. 26, DIG. 147

[56] References Cited

U.S. PATENT DOCUMENTS

| | | | |
|---|---|---|---|
| 4,364,166 | 12/1982 | Crowder et al. | 437/200 |
| 4,619,035 | 10/1986 | Hotta et al. | 148/DIG. 147 |
| 4,720,908 | 1/1988 | Wills | 437/203 |
| 4,751,198 | 6/1988 | Anderson | 148/DIG. 147 |
| 4,784,973 | 11/1988 | Stevens et al. | 437/200 |
| 4,818,723 | 4/1989 | Yen | 437/192 |
| 4,897,709 | 1/1990 | Yokoyama et al. | 437/203 |
| 4,904,620 | 2/1990 | Schmitz | 437/200 |

FOREIGN PATENT DOCUMENTS 0077117  4/1988 Japan ................................. 437/190

*Primary Examiner*—Brian E. Hearn
*Assistant Examiner*—Tuan Nguyen
*Attorney, Agent, or Firm*—Robert E. Bushnell

[57] ABSTRACT

A method of forming low-resistive contact to at least two preohmic regions formed in a silicon substrate having a thick insulating layer thereon, including the steps of depositing a polysilicon on the insulating layer, performing an anisotropic etch for opening the preohmic regions, sputter-depositing a titanium deposit, the deposited titanium having electrical disconnections on the vertical side-walls of the opening regions, siliciding the titanium deposit, and depositing a metal silicide deposit for preventing electrical disconnections. Another embodiment uses a sputter-deposited titanium silicide deposit instead of titanium silicide. Still another embodiment includes the step of forming holes by an anisotropic etch, depositing polysilicon in the holes and on the insulating layer, sputter-depositing an titanium deposit, forming an titanium silicide deposit, and depositing a metal silicide deposit.

34 Claims, 3 Drawing Sheets

METHOD OF FORMING LOW-RESISTIVE CONTACT TO N+/P+ PREOHMIC REGIONS IN VERY LARGE SCALE INTEGRATED DEVICES

FIELD OF THE INVENTION

The present invention relates to a method of forming low-resistive contact for using in very large scale intergrated (VLSI) devices, and more particularly, to a method of forming low-resistive contacts to N+ and-/or P+ preohmic regions on a silicon substrate.

BACKGROUND OF THE INVENTION

In the manufacture of VLSI devices, refractory metal silicides have been used as interconnection materials to overcome disadvantages of a polycrystalline silicon (hereinafter referred to as polysilicon). Since the polysilicon has a sheet resistance of 20 to 30 $\Omega/\square$ for a thickness of 5000 Å, it is very difficulty to achieve the reduction of R-C delay time for a high speed operation and the scaling-down of line widths for higher density. Therefore, metal silicides such as tunsten silicide, titanium silicide, platnium silicide and tantalum silicide, which may provide a lower sheet resistance, by one order of magnitude, than that of the polysilicon, have been employed to achieve the scaling-down and the high speed operation in on-chip VLSI devices.

However, some problems for metal silicides should be taken into consideration to accomplish stable and safe ohmic contacts through a silicon dioxde layer between the metal silicide and heavily doped preohmic regions in a silicon substrate.

Firstly, in order follow a CMOS fabrication process which is most widely used in the manufacture of VLSI devices, a metal silicide capable of simultaneously making ohmic contacts with N+ and P+ preohmic regions should be selected. In the prior art, the tungsten silicide has been used as a contract material for N+ preohmic regions. However, since the tungsten silicide out-diffuses dopants from N+ and P+ preohmic regions during a silicidation process requiring high temperature treatment, the contact resistance between the tungsten silicide and the preohmic regions increases.

Secondly, sputter-deposited silicides do not always provide a good step coverage on vertical side-walls of the silicon dioxide, while metal silicides formed by chemical vapor deposition (CVD) generally have good step coverage thereon.

It has been found that the titanium silicide of metal silicides has the lowest sheet resistance. Two methods of forming the titanium silicide by the sputtering technology have been known in the prior art. One is to thermally react sputter-deposited titanium with the underlying silicon. The other is to directly deposit the titanium silicide by sputtering. However, in any case, the sputter-deposited titanium may not provide a good step coverage on vertical side-walls of the silicon dioxide of about 5000 Å in thickness and may cause a serious result of electrical disconnection.

SUMMARY OF THE INVENTION

Accordingly, it is an object of the present invention to provide method of forming low-resistive contacts employing metal silicides capable of preventing electrical disconnections.

It is still another object of the present invention to provide a method of simultaneously forming stable and safe low-resistive contacts to heavily N-doped and heavily P-doped preohmic regions in a silicon substrate without electrical disconnection.

According to a preferred embodiment of the invention, the method of forming low-resistive contacts to at least two preohmic regions formed in a silicon substrate, includes the steps of forming an insulating layer on the face of the silicon layer substrate, depositing a polyrcrystalline silicon on the insulating layer, forming holes having features of vertical side walls in the insulating layer and the polycrystalline silicon layer so that face portions of the preohmic regions are completely exposed, depositing a titanium layer on the polycrystalline silicon layer and the exposed preohmic regions, forming a titanium silicide layer so that the titanium reacts with the underlying silicon, and depositing a metal silicide layer on the titanium silicide layer and the side-walls of the insulating layer.

According to another embodiment of the invention, the method of forming low-resistive contacts to at least two preohmic regions formed in a silicon substrate, includes the steps of forming an insulating layer on the face of the silicon substrate, forming holes having features of vertical side-walls in the insulating layer so that face portions of the preohmic regions are completely exposed, depositing a titanium silicide layer on the insulating layer and the exposed preohmic regions, and depositing a metal silicide layer on the titanium silicide layer and the side-walls of the insulating layer.

According to still another embodiment of the invention, the method of forming low-resistive contacts through holes in an insulating layer formed on the face of a silicon substrate to at least two preohmic regions exposed by the holes, said holes having substantially vertical side-walls in the insulating layer, includes the steps of depositing a polycrystalline silicon on the insulating layer, the side-walls of the holes and the exposed preohmic region, depositing a titanium layer on the face of the polycrystalline layer and the polycrystalline silicon layer above the exposed preohmic region, forming a titanium silicide layer so that the titanium reacts with the underlying polycrystalline silicon, and depositing a metal silicide layer on the titanium silicide and the side-walls of the polycrystalline silicon layer.

DETAILED DESCRIPTION OF THE INVENTION

Referring now to FIG. 1a through FIG. 1d, there are shown cross-sectional views of portions of a silicon slice in various processing steps according to an embodiment of the present invention.

Figure 1A:
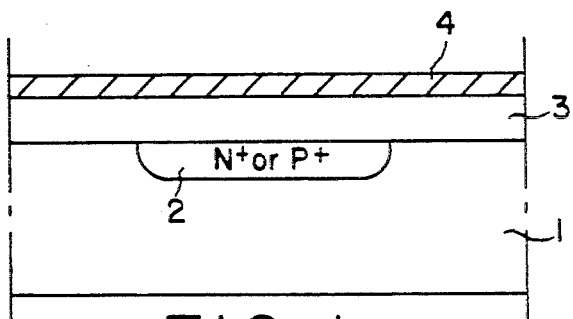
FIG. 1a through FIG. 1d are cross-sectional views of portions of a silicon slice explaining a method of forming low-resistive contacts according to the present invention.

As seen in FIG. 1a, a preohmic region 2 in which N-type or P-type impurities are heavily doped is formed on the face of a silicon substrate 1. An insulating layer 3 of about 5000Å, typically silicon dioxide layer, is formed by a thermal oxidation or a CVD on the face of the silicon substrate 1 and a polysilicon layer 4 of about 1000 Å is then deposited by a well known CVD step on the silicon dioxide layer 3.

Figure 1B:
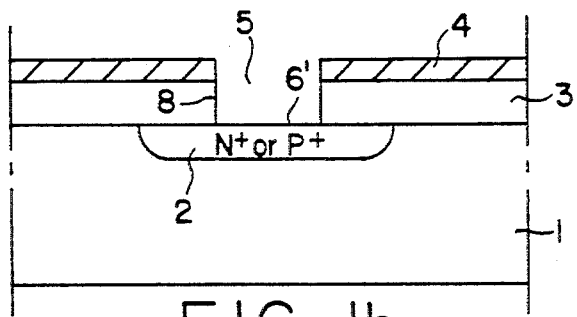

Referring to FIG. 1b, a hole 5 exposing a selected surface area of the preohmic region 2 is formed in the polysilicon layer 4 and the silicon dioxide layer 3 by an anisotropic eching technique such as RIE. Typically, the hole 5 is about 0.6 μm in width. After the formation of the hole 5, the silicon slice is moved to magnetron sputtering machine to sputter titanium, and a native silicon dioxide and surface contaminations, on the polysilicon layer 4 and the exposed preohmic area 6' which are formed by the exposure of the ambient atmosphere, are eliminated by a sputter cleaning therein. Subsequently, the titanium layer 6 of about 1000 Å is sputter-deposited in an argon ambience.

Figure 1C:
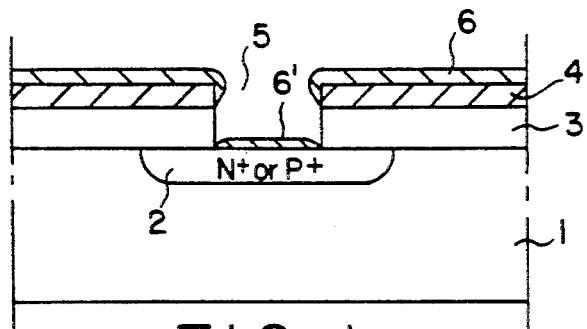
Figure 1D:
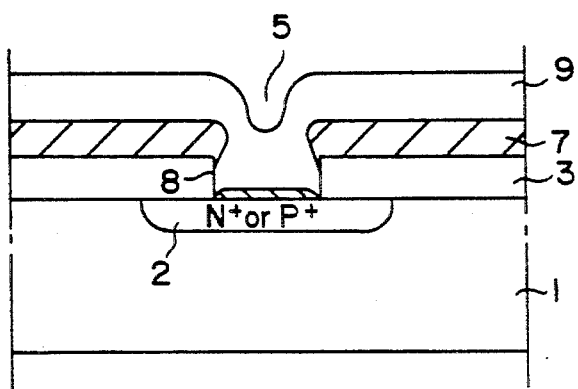

As seen in FIG. 1C, by the deposition of titanium, the thickness of a titanium layer 6 is about 500 Å on the polysilicon layer 4, although about 200 Å on the exposed preohmic area (6') in the hole 5. But there is no deposited titanium on the vertical side-walls of the silicon dioxide layer 3. After the deposition of the titanium layer 6, the silicon slice is moved to a rapid thermal annealing (RTA) machine and heated at about 850° C. for about 10 seconds in a nitrogen ambience. By this heat treatment, the titanium is converted to a titanium silicide layer 7 by reacting with the underlying silicon layer 4 as shown in FIG. 1d. During such silicidation process, unreacted portions of titanium and polysilicon any remain in the titanium silicide layer 7 according to the thickness of the titanium layer 6 and the polysilicon layer 4, surface contaminations, heating time and so on. A tungsten silicide layer 9 is deposited at 360° C. by a well known low pressure chemical vapor deposition (LPCVD) on the titanium silicide layer 7 and the vertical side-wall (8) to prevent the electrical disconnection (i.e., electrical isolation) of the titanium silicide layer 7. By the above explained process, low-resistive contact having a sheet resistance of about 2 Ω/□ may be achieved.

Figure 1E:
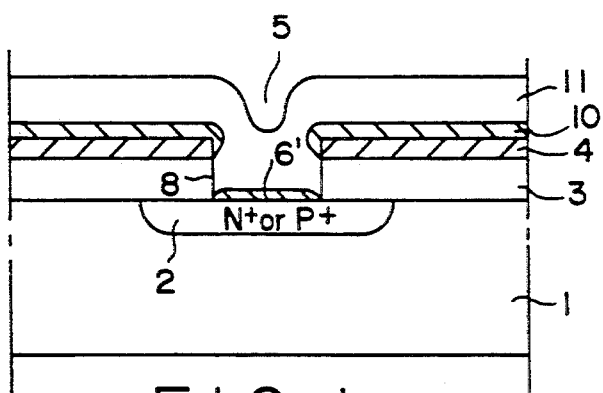
FIG. 1e is a cross-sectional view of a portion of a silicon slice showing another embodiment of the present invention.

Another embodiment of the present invention is illustrated in FIG. 1e.

Referring to FIG. 1e, after the process of FIG. 1b a titanium silicide layer 10 is formed by sputtering in the argon ambience from a titanium silicide target on the polysilicon layer 4 and the exposed preohmic area 6'. The thickness of the titanium silicide layer 10 is about 1000 Å on the polysilicon layer 4, although about 500 Å on the exposed preohmic area 6'. The target is of a silicon-rich titanium silicide having a titanium-silicon ratio of 1:2.6. As a result of the sputtered deposition, an electrical disconnection of the titanium silicide layer 10 occurs on the vertical side-wall of the silicon dioxide layer 3. To prevent the electrical disconnection, a tungsten silicide layer 11 is formed by LPCVD (i.e., by low pressure chemical vapor deposition) on the vertical side-wall 8 and the titanium silicide layer 10. Subsequently, an annealing heat treatment is performed at about 900° C. for about 20 seconds in the nitrogen ambient in the RTA machine to make the resistance of the silicide layers 10 and 11 low.

Upon the titanium silicidation, the silicon in the preohmic region 2 is consumed and stress occurs in the preohmic region 2 due to the shrinkage of the volume. Such results may produce leakage current in VLSI devices in which preohmic regions of about 0.2 μm in depth is employed. These problems may be solved by following processing steps.

Figure 2A:
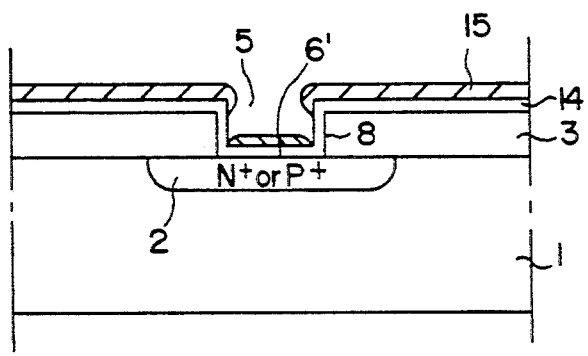
FIG. 2a and FIG. 2b are cross-sectional views of portions of a silicon slice showing still another embodiment of the present invention.

Referring to FIG. 2a, a N+ or P+ doped preohmic region 2 is formed in the silicon substrate 1. Subsequently, a silicon dioxide layer 3 is formed on the face of the silicon substrate 1 and then a hole 5 having a vertical side-wall 8 by the anisotropic eching technique is formed in the silicon dioxide layer 3 to expose a portion of the face of the preohmic region 2. Subsequently, a polysilicon layer 14 is deposited by CVD. The thickness of the polysilicon layer 14 is about 1000 Å on the silicon dioxide layer 3, although about 500 Å on the exposed preohmic area 6' and thinner on the side-wall 8. A titanium layer 15 is sputter-deposited on the polysilicon layer 14. The thickness of the titanium layer 15 on the polysilicon layer 14 is about 500 Å, although about 200 Å in the hole 5. But an electrical disconnection occurs on the side-wall 8. After the deposition of the titanium layer 15, the silicidation process is performed by the heat treatment.

Figure 2B:
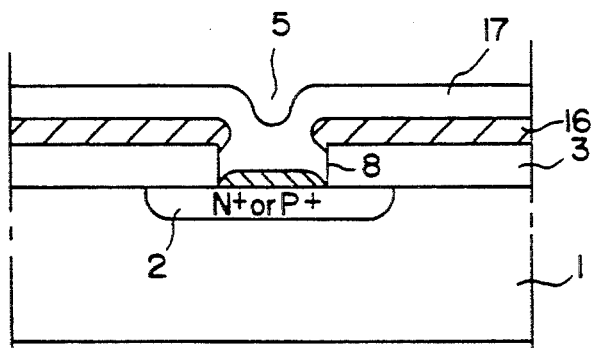

Referring to FIG. 2b, there is shown a titanium silicide layer 16 created by the silicidation process. But the electrical disconnection still remains. To prevent such electrical disconnection, a tungsten silicide layer 17 is deposited by the LPCVD on the side-wall 8 and the titanium silicide layer 16.

On the other hand, during the silicidation process, implantation may be employed to prevent an increase of the contact resistance due to the out-diffusion of dopant from the preohmic region 2. Implantation process may be peformed just before or just after the formation of the tungsten silicide layer 17. Implantation of the N+ preohmic region is performed with arsenic, as, at the dose of about $10^{16}/cm^2$, while that of the P+ preohmic region with boron, B, at the dose of about $10^{16}/cm^2$.

Other embodiments and modifications of the present invention will readily come to those skilled in the art having the benefit of the foregoing description and drawings. For example, the tungsten silicide may be a selected one of metal silicides formed at low temperature by the LPCVD. It is therefore to be understood that such modifications and embodiments are intended to fall within the spirit and scope of the appended claims.

What is claimed is:

1. A method of forming low-resistive contacts to at least two preohmic regions formed in a silicon substrate, comprising the steps of:
   forming an insulating layer on the face of the silicon substrate;
   depositing a polycrystalline silicon layer on the insulating layer;
   forming holes having features of vertical side-walls in the insulating layer and the polycrystalline silicon layer so that face portions of the preohmic regions are completely exposed;
   depositing titanium on the polycrystalline silicon layer and the exposed preohmic regions;
   forming a layer of titanium silicide so that the titanium reacts with the underlying silicon; and
   depositing a metal silicide on the titanium silicide layer and the side-walls of the insulating layer.

2. The method of claim 1, wherein the insulating layer is formed of silicon dioxide.

3. The method of claim 2, wherein the metal silicide is formed of tungsten silicide.

4. The method of claim 3, wherein the preohmic regions are formed of N+ or P+ preohmic regions.

5. The method of claim 3, wherein at least one of the preohmic regions is formed of a P+ preohmic region and remaining preohmic regions are formed of N+ preohmic regions.

6. The method of claim 5, wherein, in conjunction with the formation of the tungsten silicide layer, the concentration P-type impurities are introduced into the P+ preohmic region and high concentration N-type impurities are introduced into the N+ preohmic regions.

7. The method of claim 6, wherein the titanium is formed by sputter deposition.

8. The method of claim 7, wherein the tungsten silicide is deposited by chemical vapor deposition.

9. A method of forming low-resistive contacts to at least two preohmic regions formed in a silicon substrate, comprising the steps of:
  forming an insulating layer on the face of the silicon substrate;
  forming holes having features of vertical side-walls in the insulating layer so that face portions of the preohmic regions are completely exposed;
  depositing a layer of titanium silicide on the insulating layer and the exposed preohmic regions; and
  depositing a metal silicide on the titanium silicide layer and the side-walls of the insulating layer.

10. The method of claim 9, further comprising the step of depositing a polycrystalline silicon layer between the insulating layer and the titanium silicide.

11. The method of claim 10, wherein the insulating layer is formed of silicon dioxide.

12. The method of claim 11, wherein the metal silicide is formed of tungsten silicide.

13. The method of claim 12, wherein at least one of the preohmic regions is formed of a P+ preohmic region and remaining preohmic regions are formed of N+ preohmic regions.

14. The method of claim 13, wherein in conjunction with the formation of the tungsten silicide layer, high concentration P-type impurities are introduced into the P+ preohmic region and high concentration N-type impurities are introduced into the N+ preohmic regions.

15. The method of claim 14, wherein the titanium silicide is formed by sputter deposition.

16. The method of claim 15, wherein the titanium silicide is a titanium-silicon composition having ratio of 1:2.6.

17. The method of claim 15, wherein the titanium silicide is formed by sputtering.

18. The method of claim 11, wherein the preohmic regions are formed of N+ or P+ preohmic regions.

19. A method of forming low-resistive contacts through holes in an insulating layer formed on the face of a silicon substrate to at least two preohmic regions exposed by said holes, said holes having substantially vertical side-walls in the insulating layer, comprising the steps of:
  depositing polycrystalline silicon on the insulating layer, the side-walls of the holes and the exposed preohmic region;
  depositing titanium on the face of the polycrystalline layer and the polycrystalline silicon above the exposed preohmic region;
  forming a layer of titanium silicide so that the titanium reacts with the underlying polycrystalline silicon; and
  depositing a metal silicide on the titanium silicide layer and the side-walls of the polycrystalline silicon.

20. The method of claim 19, comprised of forming the insulating layer of silicon dioxide.

21. The method of claim 20, wherein the metal silicide is formed of tungsten silicide.

22. The method of claim 21, wherein the preohmic regions are formed of N+ or P+ preohmic regions.

23. The method of claim 21, wherein at least one of the preohmic regions is formed of a P+ region and remaining preohmic regions are formed of N+ preohmic regions.

24. The method of claim 23, wherein in conjunction with the formation of the tungsten silicide layer, high concentration P-type impurities are introduced into the P+ preohmic region and high concentration N-type impurities are introduced into the N+ preohmic regions.

25. The method of claim 24, wherein the titanium is formed by sputter deposition.

26. The method of claim 25, wherein the tungsten silicide is deposited by chemical vapor deposition.

27. A method of forming low-resistive contracts to a preohmic region of a substrate, comprising:
  forming an electrically insulating layer on a face of the substrate bearing a preohmic region;
  forming a hole in the insulating layer to expose a portion of the face of the preohmic region in the substrate, with the hole having generally vertically disposed side-walls;
  concurrently forming a layer of titanium silicide on the insulating layer and a layer of titanium silicide on the exposed face portion of the preohmic region; and
  depositing a layer of metal silicide electrically connecting the titanium silicide layer formed on the insulating layer and the titanium silicide layer formed on the exposed face portion of the preohmic region.

28. The method of claim 27, further comprised of concurrently forming said layers of titanium silicide by:
  forming a polycrystalline silicon layer on the insulating layer and the exposed face portion of the preohmic region;
  forming a titanium layer on the polycrystalline silicon layer; and
  causing the titanium layer to react with the polycrystalline silicon layer to form said layer of titanium silicide.

29. The method of claim 27, further comprised of:
  forming a layer of polycrystalline silicon upon said insulating layer;
  forming said hole through said insulating layer and said polysilicon layer; and
  concurrently forming said layers of titanium silicide by sputtering from a silicon-rich titanium-silicide target, onto said polycrystalline silicon layer and onto said exposed face portion of the preohmic region.

30. The method of claim 29, further comprised of subjecting the preohmic region to ion implantation in conjunction with the step of electrically connecting the titanium silicide layers by depositing said layer of metal silicide.

31. The method of claim 27, further comprised of:
  forming a layer of polycrystalline silicon upon said insulating layer, upon the exposed face portion of the preohmic region, and upon the side-walls of the hole;

forming a titanium layer on the polycrystalline silicon layer; and causing the titanium layer to react with the polycrystalline silicon layer to form said layer of titanium silicide.

32. The method of claim 31, further comprised of subjecting the preohmic region to ion implantation in conjunction with the step of electrically connecting the titanium silicide layers by depositing said layer of metal silicide.

33. The method of claim 27, further comprised of subjecting the preohmic region to ion implantation is conjunction with the step of electrically connecting the titanium silicide layers by depositing said layer of metal silicide.

34. The method of claim 28, further comprised of subjecting the preohmic region to ion implantation in conjunction with the step of electrically connecting the titanium silicide layers by depositing said layer of metal silicide.

* * * * *

UNITED STATES PATENT AND TRADEMARK OFFICE
CERTIFICATE OF CORRECTION

PATENT NO.    : 5,070,038
DATED         : December 3, 1991
INVENTOR(S)   : Dae-Je Jin et al.

It is certified that error appears in the above-identified patent and that said Letters Patent is hereby corrected as shown below:

<u>Title page,</u>
Item [75], Inventors, enter the second inventor's name -- Chang-Hyun Kim, Seoul, Korea --; and enter the third inventor's name -- Chul-Jin Lee, Suwon-city, Korea --.

Signed and Sealed this

Third Day of June, 2003

JAMES E. ROGAN
*Director of the United States Patent and Trademark Office*